US012593521B2

(12) United States Patent
Ho et al.

(10) Patent No.: US 12,593,521 B2
(45) Date of Patent: Mar. 31, 2026

(54) IMAGE SENSOR AND METHOD OF MANUFACTURING THE SAME

(71) Applicant: VisEra Technologies Company Ltd.,
Hsin-Chu City (TW)

(72) Inventors: Shih-Yu Ho, Hsinchu City (TW);
Yueh-Ching Cheng, Hsinchu City
(TW); Yu-Chi Chang, Hsin-Chu City
(TW)

(73) Assignee: **VISERA TECHNOLOGIES
COMPANY LTD.**, Hsin-Chu City
(TW)

( * ) Notice: Subject to any disclaimer, the term of this
patent is extended or adjusted under 35
U.S.C. 154(b) by 671 days.

(21) Appl. No.: 17/710,238

(22) Filed: Mar. 31, 2022

(65) Prior Publication Data

US 2023/0317751 A1     Oct. 5, 2023

(51) Int. Cl.
H01L 27/146     (2006.01)
G02B 3/00     (2006.01)
(Continued)

(52) U.S. Cl.
CPC ......... H10F 39/806 (2025.01); H10F 39/024
(2025.01); H10F 39/184 (2025.01); **H10F
39/8063** (2025.01)

(58) Field of Classification Search
CPC ......... H01L 27/14629; H01L 31/02327; H01L
27/14623; H01L 27/14685;
(Continued)

(56) References Cited

U.S. PATENT DOCUMENTS 8,816,358 B1 *    8/2014   Tsai ...................... H10K 30/80
257/E31.127
10,553,733 B2 *   2/2020   Huang ................ H01L 27/1464
(Continued)

FOREIGN PATENT DOCUMENTS

CN          110972505        4/2020
JP          2009218357       9/2009
(Continued)

OTHER PUBLICATIONS

David F. Edwards, Handbook of Optical Constants of Solids, 1985,
Academic Press, pp. 547-569 (https://www.sciencedirect.com/science/
article/pii/B9780080547213500290) (Year: 1985).*

*Primary Examiner* — Ajay Ojha
*Assistant Examiner* — Tsz K Chiu
(74) *Attorney, Agent, or Firm* — LIU & LIU

(57) ABSTRACT

The image sensor includes a semiconductor substrate, a
pillar array layer, a planar layer, and a microlens layer. The
semiconductor substrate includes a first photodiode and a
second photodiode. The pillar array layer is disposed on the
semiconductor substrate, the pillar array layer includes a first
pillar array disposed above the first photodiode and a second
pillar array disposed above the second photodiode. The first
pillar array includes a plurality of first pillar structures, the
second pillar array includes a plurality of second pillar
structures, all the first pillar structures have a first height, and
all the second pillar structures have a second height. The
planar layer is disposed on the pillar array layer. The
microlens layer is disposed on the planar layer.

17 Claims, 17 Drawing Sheets

(51) Int. Cl.
  *G02B 27/10*          (2006.01)
  *H10F 39/00*          (2025.01)
  *H10F 39/18*          (2025.01)

(58) Field of Classification Search
  CPC ........... H01L 31/02164; H01L 27/1446; H10F
    39/8063; H10F 39/8053; H10F 39/024;
    H10F 39/199; H10F 39/811; H10F 39/18;
    H10F 39/807; H10F 39/8067; H10F
    39/182; H10F 39/014; H10F 39/805;
    H10F 39/806; H10F 39/8057; H10F
    39/802; H10F 39/8033; H10F 39/8037;
    H10F 39/011; H10F 39/026; H10F
    39/80373; H10F 39/8023; H10F 39/803;
    H10F 39/80377; H10F 77/40; H10F
    77/93; H10F 39/8027; H10F 39/804;
    H10F 77/147; H10F 77/337; H10F
    77/413; H10F 39/809; H10F 39/813;
    H10F 39/184; H10F 77/20; H10F 30/223;
    H10F 39/107; H10F 39/80; H10F 39/812;
    H10F 77/148; H10F 77/334; H10F
    30/2235; H10F 71/00; H10F 77/122;
    H10F 77/16; H10F 10/17; H10F 30/221;
    H10F 39/151; H10F 39/1532; H10F
    55/255; H10F 71/121; H10F 77/244;
    H10F 77/50; H10F 10/165; H10F 10/174;
    H10F 30/225; H10F 30/2255; H10F
    39/018; H10F 39/1825; H10F 71/1212;
    H10F 71/1215; H10F 71/127; H10F
    71/1272; H10F 77/1226; H10F 77/1228;
    H10F 77/124; H10F 77/1248; H10F
    77/14; H10F 77/143; H10F 77/1437;
    H10F 77/206; H10F 77/247; H10F 77/42;
    H10F 77/60; H10F 77/703; H10F 77/933;
    H10F 77/953; H10F 39/016; H10F
    39/028; H10F 39/103; H10F 39/12; H10F
    39/198; H10F 77/1625; H10F 77/166;
    H10F 77/95; H10F 99/00; H10F 10/14;
    H10F 30/10; H10F 30/20; H10F 30/22;
    H10F 30/227; H10F 30/2823; H10F
    77/00; H10F 77/1433; H10F 77/331;
    H10F 77/407; H10F 77/48; H10F 77/70
  See application file for complete search history.

(56) References Cited

U.S. PATENT DOCUMENTS

| | | | | |
|---|---|---|---|---|
| 2009/0035887 | A1* | 2/2009 | Suzuki .................. | H10F 39/805 |
| | | | | 438/57 |
| 2010/0244168 | A1* | 9/2010 | Shiozawa ......... | H01L 27/14621 |
| | | | | 257/E31.127 |
| 2012/0242873 | A1* | 9/2012 | Toumiya ............. | H10F 39/8023 |
| | | | | 348/E9.002 |
| 2015/0123230 | A1* | 5/2015 | Jin .................... | H01L 27/14645 |
| | | | | 257/432 |
| 2015/0241603 | A1* | 8/2015 | Fujii ................. | G02F 1/133502 |
| | | | | 359/601 |
| 2017/0110493 | A1* | 4/2017 | Yokogawa ........ | H01L 31/03762 |
| 2017/0141151 | A1* | 5/2017 | Sato .................. | H01L 27/14623 |

FOREIGN PATENT DOCUMENTS

| | | | | |
|---|---|---|---|---|
| JP | 2010232537 | | 10/2010 | |
| JP | 2012009704 | | 1/2012 | |
| JP | 2012238774 | | 12/2012 | |
| JP | 2013033864 | | 2/2013 | |
| JP | 2015068853 | | 4/2015 | |
| JP | 2017134362 | | 8/2017 | |
| JP | 2019046960 | | 3/2019 | |
| JP | 2020174158 | | 10/2020 | |
| JP | 2021068816 | | 4/2021 | |
| JP | 2021072295 | | 5/2021 | |
| KR | 100788349 | B | 1/2008 | |
| KR | 20140041548 | A | 4/2014 | |
| KR | 20200098490 | A | 8/2020 | |
| WO | WO-2012008387 | A1 * | 1/2012 | .......... H10F 77/413 |
| WO | 2014065373 | | 5/2014 | |
| WO | 2018092632 | | 5/2018 | |
| WO | 2019124562 | | 6/2019 | |
| WO | 2021072295 | | 5/2021 | |

* cited by examiner

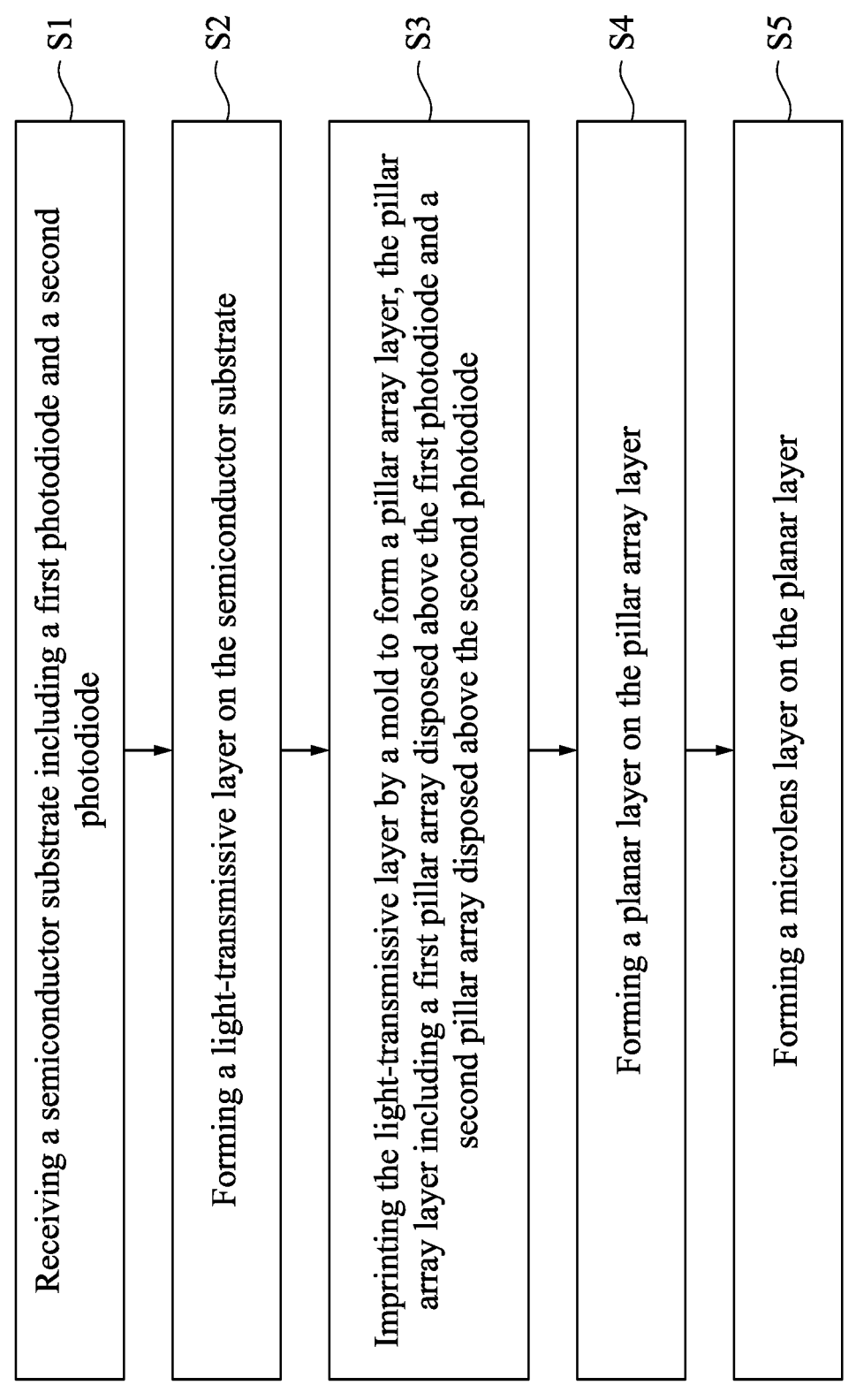

800

S1 Receiving a semiconductor substrate including a first photodiode and a second photodiode S2 Forming a light-transmissive layer on the semiconductor substrate S3 Imprinting the light-transmissive layer by a mold to form a pillar array layer, the pillar array layer including a first pillar array disposed above the first photodiode and a second pillar array disposed above the second photodiode S4 Forming a planar layer on the pillar array layer S5 Forming a microlens layer on the planar layer

Fig. 8

IMAGE SENSOR AND METHOD OF MANUFACTURING THE SAME

BACKGROUND

Field of Invention

The present disclosure relates to an image sensor and a method of manufacturing the image sensor.

Description of Related Art

In general, an image sensor typically has a microlens layer and a semiconductor substrate, and the microlens layer is located above the semiconductor substrate. Light may pass through the microlens layer and be absorbed by photodiodes in the semiconductor substrate. However, the microlens layer and the semiconductor substrate have different refractive indexes. The light may generate reflection when the light passes through the microlens layer and the semiconductor substrate. As a result, the light absorbed by the photodiodes in the semiconductor substrate is reduced. In addition, due to the diffraction of the light, the image sensor may generate petal flares when the light passes through the microlens layer and the semiconductor substrate, thereby reducing the performance of the image sensor.

SUMMARY

One aspect of the present disclosure is to provide an image sensor. The image sensor includes a semiconductor substrate, a pillar array layer, a planar layer, and a microlens layer. The semiconductor substrate including a first photodiode and a second photodiode. The pillar array layer is disposed on the semiconductor substrate, the pillar array layer includes a first pillar array disposed above the first photodiode and a second pillar array disposed above the second photodiode. The first pillar array includes a plurality of first pillar structures, the second pillar array includes a plurality of second pillar structures, all the first pillar structures have a first height, and all the second pillar structures have a second height. The pillar array layer satisfies at least one of the following conditions: (1) the first height of the each first pillar structure is different from the second height of the each second pillar structure; (2) a pitch between two of the first pillar structures is different from a pitch between two of the second pillar structures; and (3) a shape of the each first pillar structure is different from a shape of the each second pillar structure. The planar layer is disposed on the pillar array layer. The microlens layer is disposed on the planar layer.

According to some embodiments of the present disclosure, the first height of the each first pillar structure is in a range from 0.1 μm to 1.6 μm, and the second height of the each second pillar structure is in a range from 0.1 μm to 1.6 μm.

According to some embodiments of the present disclosure, the pitch between two of the first pillar structures is in a range from 0.3 μm to 0.5 μm, and the pitch between two of the second pillar structures is in a range from 0.3 μm to 0.5 μm.

According to some embodiments of the present disclosure, the pitch between two of the first pillar structures in a first direction is greater than the pitch between two of the second pillar structures in the first direction, the pitch between two of the first pillar structures in a second direction is the same as the pitch between two of the second pillar structures in the second direction, and the first direction is substantially perpendicular to the second direction.

According to some embodiments of the present disclosure, the pitch between two of the first pillar structures in a first direction is greater than the pitch between two of the second pillar structures in the first direction, the pitch between two of the first pillar structures in a second direction is greater than the pitch between two of the second pillar structures in the second direction, and the first direction is substantially perpendicular to the second direction.

According to some embodiments of the present disclosure, the pitch between two of the first pillar structures in a first direction is greater than the pitch between two of the second pillar structures in the first direction, the pitch between two of the first pillar structures in a second direction is less than the pitch between two of the second pillar structures in the second direction, and the first direction is substantially perpendicular to the second direction.

According to some embodiments of the present disclosure, an arrangement of the first pillar array is a A×B array, an arrangement of the second pillar array is a C×D array, A, B, C, D are positive integers, A is different from or equal to B, and C is different from or equal to D.

According to some embodiments of the present disclosure, A, B, C, and D are in a range from 4 to 9.

According to some embodiments of the present disclosure, the shape of a top surface of the each first pillar structure is a rectangle, circle, square, or ellipse shape, and the shape of a top surface of the each second pillar structure is a rectangle, circle, square, or ellipse shape.

According to some embodiments of the present disclosure, the shape of a bottom surface of the each first pillar structure is a rectangle, circle, square, or ellipse shape, and the shape of a bottom surface of the each second pillar structure is a rectangle, circle, square, or ellipse shape.

According to some embodiments of the present disclosure, a width of a top surface of the each first pillar structure is less than a width of a bottom surface of the each first pillar structure, and a width of a top surface of the each second pillar structure is less than a width of a bottom surface of the each second pillar structure.

According to some embodiments of the present disclosure, the width of the top surface of the each first pillar structure is in a range from 0.16 μm to 0.4 μm, the width of the bottom surface of the each first pillar structure is in a range from 0.2 μm to 0.5 μm, the width of the top surface of the each second pillar structure is in a range from 0.16 μm to 0.4 μm, and the width of the bottom surface of the each second pillar structure is in a range from 0.2 μm to 0.5 μm.

According to some embodiments of the present disclosure, all the first pillar structures are identical, all the second pillar structures are identical, and the first pillar structures are different from the second pillar structures.

According to some embodiments of the present disclosure, a refractive index of the first pillar structures is in a range from 1.4 to 1.6, and a refractive index of the second pillar structures is in a range from 1.4 to 1.6.

According to some embodiments of the present disclosure, a thickness of the planar layer is in a range from 3.3 μm to 3.9 μm.

According to some embodiments of the present disclosure, a material of the pillar array layer is different from a material of the planar layer.

According to some embodiments of the present disclosure, the image sensor is configured to receive a light having a wavelength in a range from 920 nm to 960 nm.

According to some embodiments of the present disclosure, the semiconductor substrate further includes a third photodiode, a portion of the pillar array layer above the third photodiode is free of any pillar structures.

One aspect of the present disclosure is to provide a method of manufacturing an image sensor includes the following steps. A semiconductor substrate including a first photodiode and a second photodiode is received. A light-transmissive layer is formed on the semiconductor substrate. The light-transmissive layer is imprinted by a mold to form a pillar array layer. The pillar array layer including a first pillar array disposed above the first photodiode and a second pillar array disposed above the second photodiode. The first pillar array includes a plurality of first pillar structures, the second pillar array includes a plurality of second pillar structures, all the first pillar structures have a first height, and all the second pillar structures have a second height. The pillar array layer satisfies at least one of the following conditions: (1) the first height of the each first pillar structure is different from the second height of the each second pillar structure; (2) a pitch between two of the first pillar structures is different from a pitch between two of the second pillar structures; and (3) a shape of the each first pillar structure is different from a shape of the each second pillar structure. A planar layer is formed on the pillar array layer. A microlens layer is formed on the planar layer.

According to some embodiments of the present disclosure, the method further including performing a curing operation on the light-transmissive layer to form the pillar array layer, after imprinting the light-transmissive layer by the mold to form the pillar array layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B and FIG. 2C are top views of top surfaces of pillar array layers in

FIG. 2A.

FIG. 8 is a flow chart of a method of manufacturing an image sensor in accordance with some embodiments of the present disclosure.

DETAILED DESCRIPTION

Figure 1A:
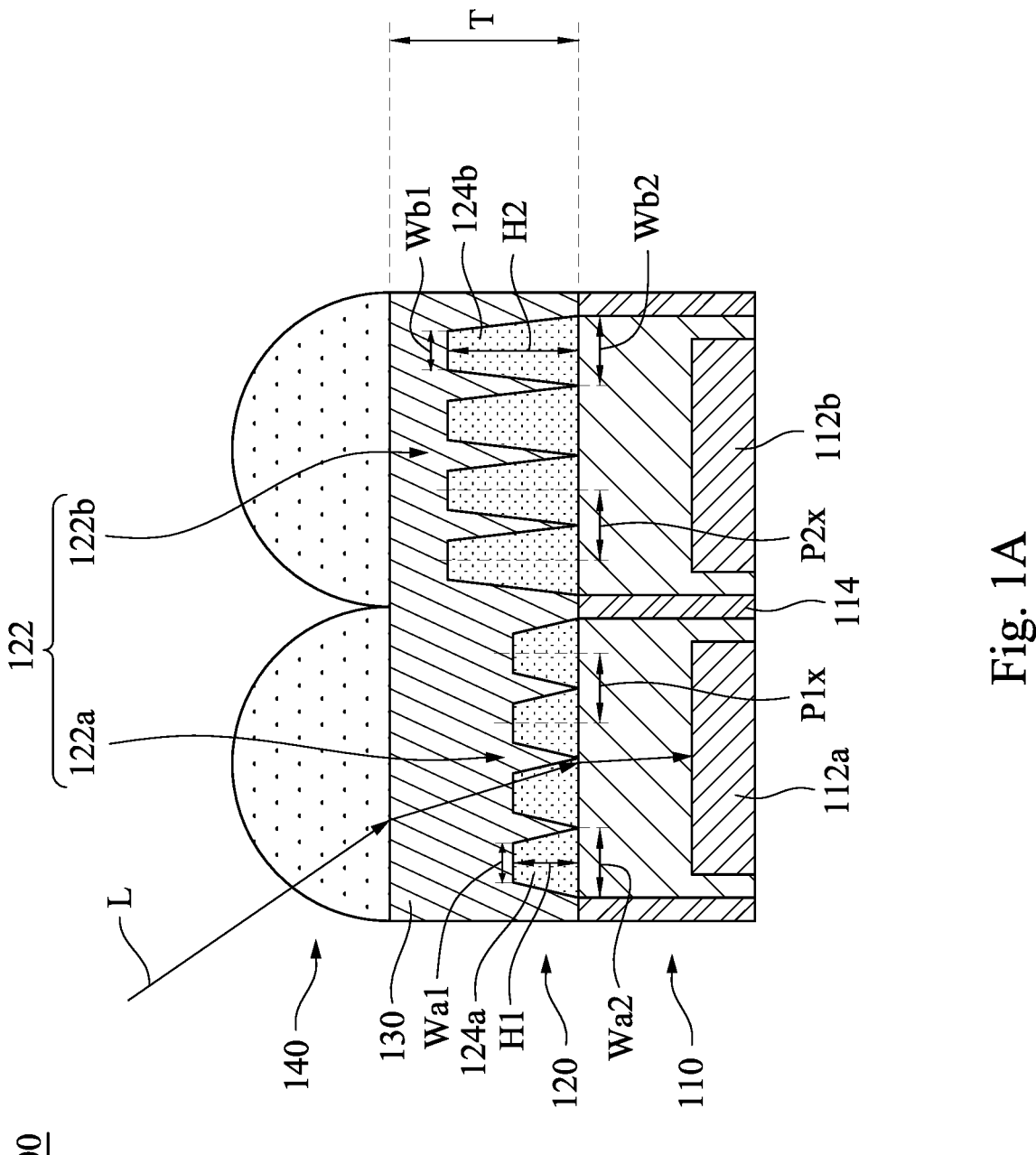
FIG. 1A is a cross-sectional view of an image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The image sensor of the present disclosure includes a pillar array layer that has a plurality of pillar structures, in which the pillar structures have tapered structures. The refractive indexes of the pillar structures are smoothly changed. Therefore, after light L entering into the image sensor through the pillar array layer between microlens and photodiodes, the light L would not tend to be reflected, so that a path of the light L may be extended, thereby increasing the light absorption rate of the photodiodes and the performance of the image sensor. In addition, heights, pitches, and shapes among a plurality of pillar arrays of the pillar array layer could be different, so that the petal flares generated by the diffraction of the light L may be reduced.

FIG. 1A is a cross-sectional view of an image sensor 100 in accordance with some embodiments of the present disclosure. The image sensor 100 includes a semiconductor substrate 110, a pillar array layer 120, a planar layer 130, and a microlens layer 140. The semiconductor substrate 110 includes a first photodiode 112a and a second photodiode 112b. The second photodiode 112b is disposed aside the first photodiode 112a along a direction X. The first photodiode 112a and the second photodiode 112b are separated by a shielding element 114. The shielding element 114 is configured to avoid light interference between the first photodiode 112a and the second photodiode 112b. The first photodiode 112a and/or the second photodiode 112b may be made of a Si photodiode, a Ge on Si photodiode, or other suitable photodiode. The pillar array layer 120 is disposed on the semiconductor substrate 110. The pillar array layer 120 includes pillar arrays 122 which including a first pillar array 122a and a second pillar array 122b. The second pillar array 122b is disposed aside the first pillar array 122a along the direction X. The planar layer 130 is disposed on the pillar array layer 120. Specifically, the planar layer 130 covers the first photodiode 112a, the second photodiode 112b, and the semiconductor substrate 110. The microlens layer 140 is disposed on the planar layer 130. In other words, the pillar array layer 120 is embedded in the planar layer 130, and between the semiconductor substrate 110 and the microlens layer 140. The microlens layer 140 includes a plurality of the microlens and is configured to receive external light L. Each of the microlens of the microlens layer 140 aligns with the first pillar array 122a and the first photodiode 112a in a direction Z, and each of the microlens of the microlens layer 140 aligns with the second pillar array 122b and the second photodiode 112b in the direction Z. The light L may pass along the direction Z through the microlens layer 140, the planar layer 130, and the pillar array layer 120 to the first photodiode 112a and the second photodiode 112b in the semiconductor substrate 110. In some embodiments, the image sensor 100 is configured to receive the light L having a wavelength in a range from 920 nm to 960 nm, such as 930, 940, or 950 nm.

Still refer to FIG. 1A. The first pillar array 122a of the pillar array layer 120 is disposed above the first photodiode 112a, and the second pillar array 122b of the pillar array layer 120 is disposed above the second photodiode 112b. The first pillar array 122a includes a plurality of first pillar structures 124a, and all the first pillar structures 124a have a first height H1. The second pillar array 122b includes a plurality of second pillar structures 124b, and all the second pillar structures 124b have a second height H2. In one embodiment, the first height H1 of each first pillar structure 124a is different from the second height H2 of each second pillar structure 124b, as shown in FIG. 1A. In this embodiment, the petal flares generated by the diffraction of the light L may be reduced. For example, when the applied wavelength of the pillar array layer 120 is about 940 nm, the petal flares may be reduced by about 25%, and a quantum efficiency of the image sensor 100 may be kept at about 20%. In some embodiments, the first height H1 and the second height H2 are in a range from 0.1 μm to 1.6 μm, respectively, such as, 0.12, 0.13, 0.14, or 0.15 μm.

In some embodiments, a refractive index of the first pillar structures 124a and the second pillar structures 124b of the pillar array layer 120 are in a range from 1.4 to 1.6, respectively, such as 1.5. It is understood that the light L in FIG. 1A (also in FIG. 2A and FIG. 3A below) is merely shown for ease of illustration, the travel direction of the light L would be changed when the light L enters from a medium into another medium. In some embodiments, a refractive index of the microlens layer 140 is less than a refractive index of the planar layer 130, the refractive index of the planar layer 130 is less than the refractive index of the pillar array layer 120, and the refractive index of the pillar array layer 120 is less than a refractive index of the semiconductor substrate 110. Specifically, the refractive indexes of the image sensor 100 from top to bottom are gradually increased due to the pillar structures 124a, 124b have tapered structures, so the possibility of reflection of the light L may be reduced when the light L passes through the microlens layer 140, the planar layer 130, and the pillar array layer 120 to the first photodiode 112a and the second photodiode 112b in the semiconductor substrate 110. In addition, since the first height H1 of each first pillar structure 124a is different from the second height H2 of each second pillar structure 124b, the diffraction of the light L may be improved to reduce the petal flares of the image sensor 100, thereby increasing the performance of the image sensor 100. In some embodiments, the first pillar structures 124a and the second pillar structures 124b of the pillar array layer 120 may be made of a material that includes dielectric materials, such as $SiO_2$ and SiN.

As shown in FIG. 1A, the first pillar structures 124a and the second pillar structures 124b of the pillar array layer 120 are tapered shapes. Specifically, a width Wa1 of a top surface of the first pillar structure 124a is less than a width Wa2 of a bottom surface of each first pillar structure 124a. A width Wb1 of a top surface of each second pillar structure 124b is less than a width Wb2 of a bottom surface of each second pillar structure 124b. Since the first pillar structures 124a and the second pillar structures 124b are tapered structures, the refractive indexes (from top to bottom) of the first pillar structures 124a and the second pillar structures 124b are smoothly increased, thereby the first pillar structures 124a and the second pillar structures 124b may provide an anti-reflective effect and so a path of the light L may be extended. As a result, the first photodiode 112a and the second photodiode 112b in the semiconductor substrate 110 may absorb the desired amount of the light L to increase the performance of the image sensor 100. In some embodiments, the width Wa1 of the top surface of each first pillar structure 124a is in a range from 0.16 μm to 0.4 μm, and the width Wa2 of the bottom surface of each first pillar structure 124a is in a range from 0.2 μm to 0.5 μm. In some embodiments, the width Wb1 of the top surface of each second pillar structure 124b is in a range from 0.16 μm to 0.4 μm, and the width Wb2 of the bottom surface of each second pillar structure 124b is in a range from 0.2 μm to 0.5 μm.

Please refer to FIG. 1A again. In some embodiments, a thickness T of the planar layer 130 is in a range from 3.3 μm to 3.9 μm, such as 3.4, 3.5, 3.6, 3.7, or 3.8 μm. For example, when the applied wavelength of the pillar array layer 120 is 940 nm and the thickness T of the planar layer 130 is 3.5 μm, the petal flares may be reduced by about 32%, and the quantum efficiency of the image sensor 100 may be kept at 20%. In some embodiments, the planar layer 130 may be made of a material that includes polymer. In some embodiments, a material of the pillar array layer 120 is different from a material of the planar layer 130.

Figure 1B:
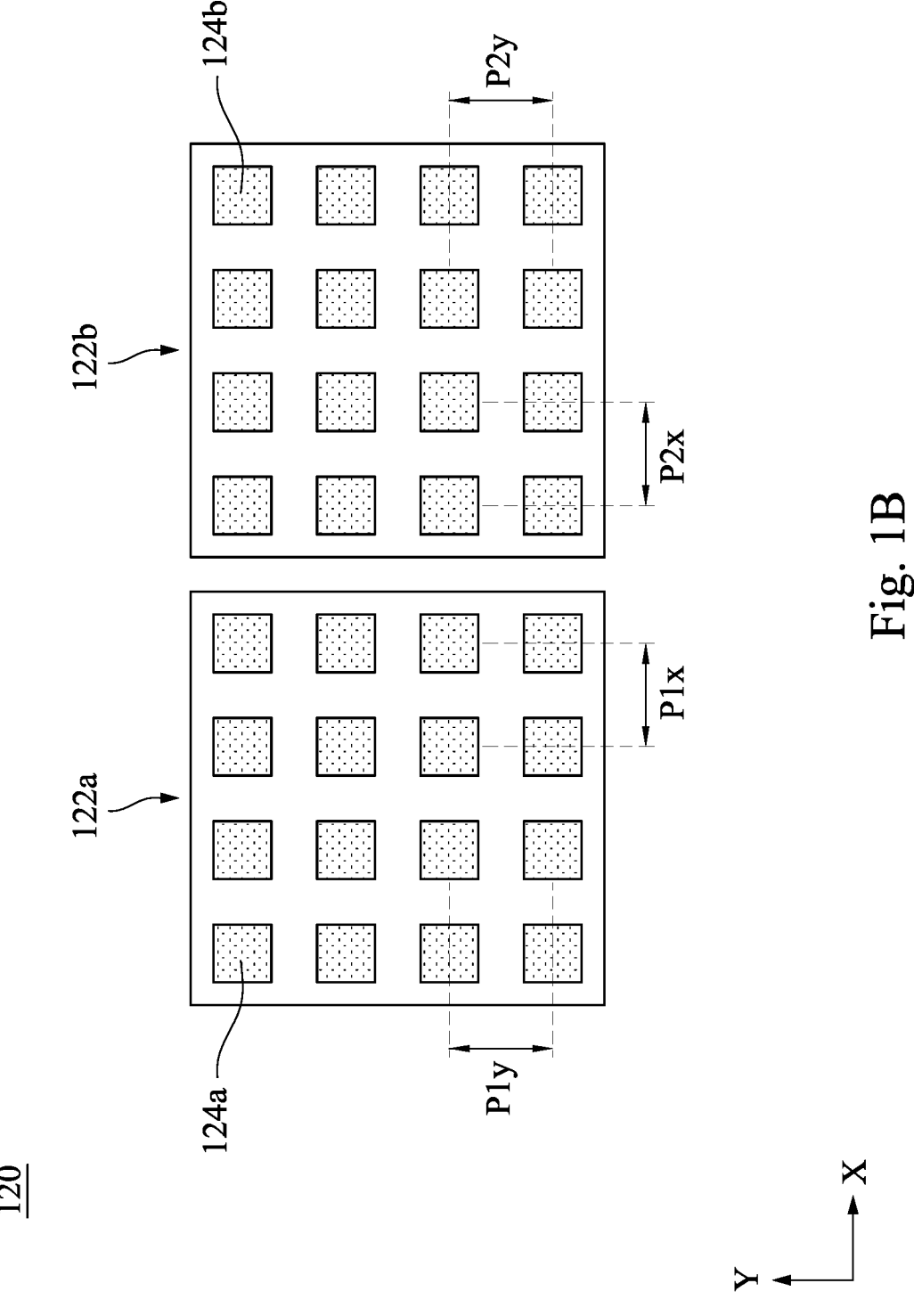
FIG. 1B is a top view of a top surface of a pillar array layer in FIG. 1A.

FIG. 1B is a top view of the top surface of the pillar array layer 120 in FIG. 1A. Each top surface of the first pillar structures 124a in the first pillar array 122a is a square shape, and each top surface of the second pillar structures 124b in the second pillar array 122b is a square shape. In some embodiments, an arrangement of the first pillar array 122a is a A×B array, and an arrangement of the second pillar array 122b is a C×D array. A, B, C, D are positive integers, A is different from or equal to B, and C is different from or equal to D. In some embodiments, A, B, C, and D are in a range from 4 to 9, such as 5, 6, 7, or 8. Specifically, if A is equal to B (or C is equal to D), it may be a 4×4, 5×5, 6×6, 7×7, 8×8, or 9×9 array. As shown in FIG. 1B, the first pillar array 122a is a 4×4 array, and the second pillar array 122b is a 4×4 array. In one embodiment, all the first pillar structures 124a of the first pillar array 122a are identical, all the second pillar structures 124b of the second pillar array 122b are identical, and the first pillar structures 124a are different from the second pillar structures 124*b*. If A is different from B (or C is different from D), it may be a random array, such as a 4×5, 4×6, 4×7, 4×8, 4×9, 5×4, 5×6, 5×7, 5×8, 5×9, 6×4, 6×5, 6×7, 6×8, 6×9, 7×4, 7×5, 7×6, 7×8, 7×9, 8×4, 8×5, 8×6, 8×7, 8×9, 9×4, 9×5, 9×6, 9×7, 9×8 array. Some embodiments of the first pillar array 122*a* and the second pillar array 122*b* of the present disclosure will be described in detail below.

It is understood that a "pitch" herein includes a pitch in a direction X and a pitch in a direction Y, in which the direction X is substantially perpendicular to the direction Y. Please refer to FIG. 1A again. The "pitch" herein is defined by a distance between every two pillar structures (such as the first pillar structures 124*a* and the second pillar structures 124*b*), and the pitch is a repeat unit to form a pillar array (such as the first pillar array 122*a* and the second pillar array 122*b*). Please refer to FIG. 1A and FIG. 1B again. Since both the first pillar array 122*a* and the second pillar array 122*b* are 4×4 arrays, a pitch P1x between two of the first pillar structures 124*a* in the direction X is the same as a pitch P2x between two of the second pillar structures 124*b* in the direction X, and a pitch Ply between two of the first pillar structures 124*a* in the direction Y is the same as a pitch P2y between two of the second pillar structures 124*b* in the direction Y. In some embodiments, the pitch (including the pitch P1x in the direction X and the pitch Ply in the direction Y) between two of the first pillar structures 124*a* is in a range from 0.3 μm to 0.5 μm, such as 0.35, 0.4, or 0.45 μm. In some embodiments, the pitch (including the pitch P2x in the direction X and the pitch P2y in the direction Y) between two of the second pillar structures 124*b* is in a range from 0.3 μm to 0.5 μm, such as 0.35, 0.4, or 0.45 μm.

FIG. 2A, FIG. 2B, FIG. 2C, FIG. 3A, FIG. 3B, FIG. 4, FIG. 5A, FIG. 5B, FIG. 6, and FIG. 7 illustrate various embodiments cross-sectional views and top views of top surfaces of the image sensor 100. Reference numerals are repeated herein to show the same or similar features shown in FIG. 1A and FIG. 1B, and the description above applies equally to the embodiments described below, and the details thereof are not repeatedly described.

Figure 2A:
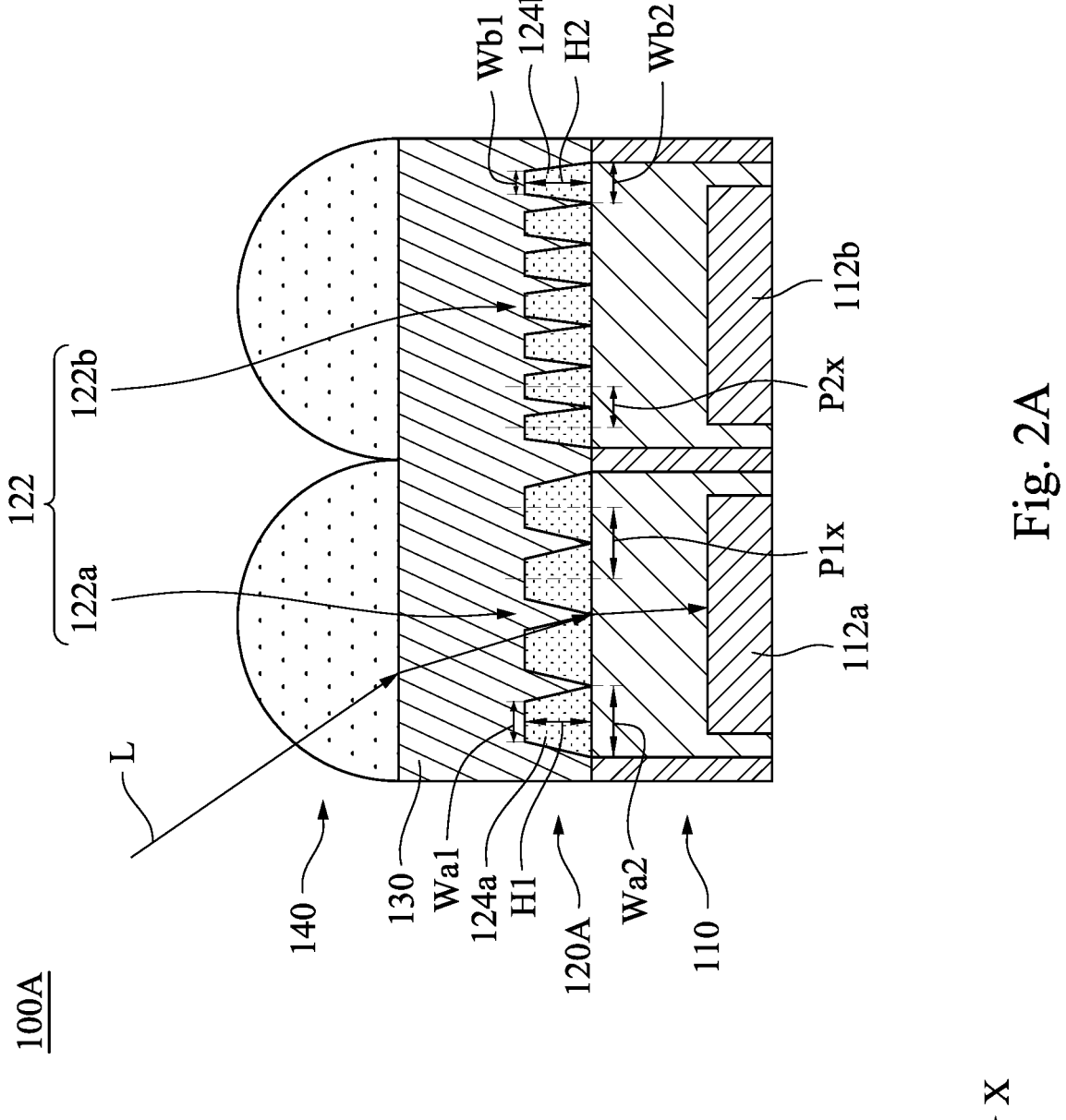
FIG. 2A is a cross-sectional view of an image sensor in accordance with some embodiments of the present disclosure.
Figure 2B:
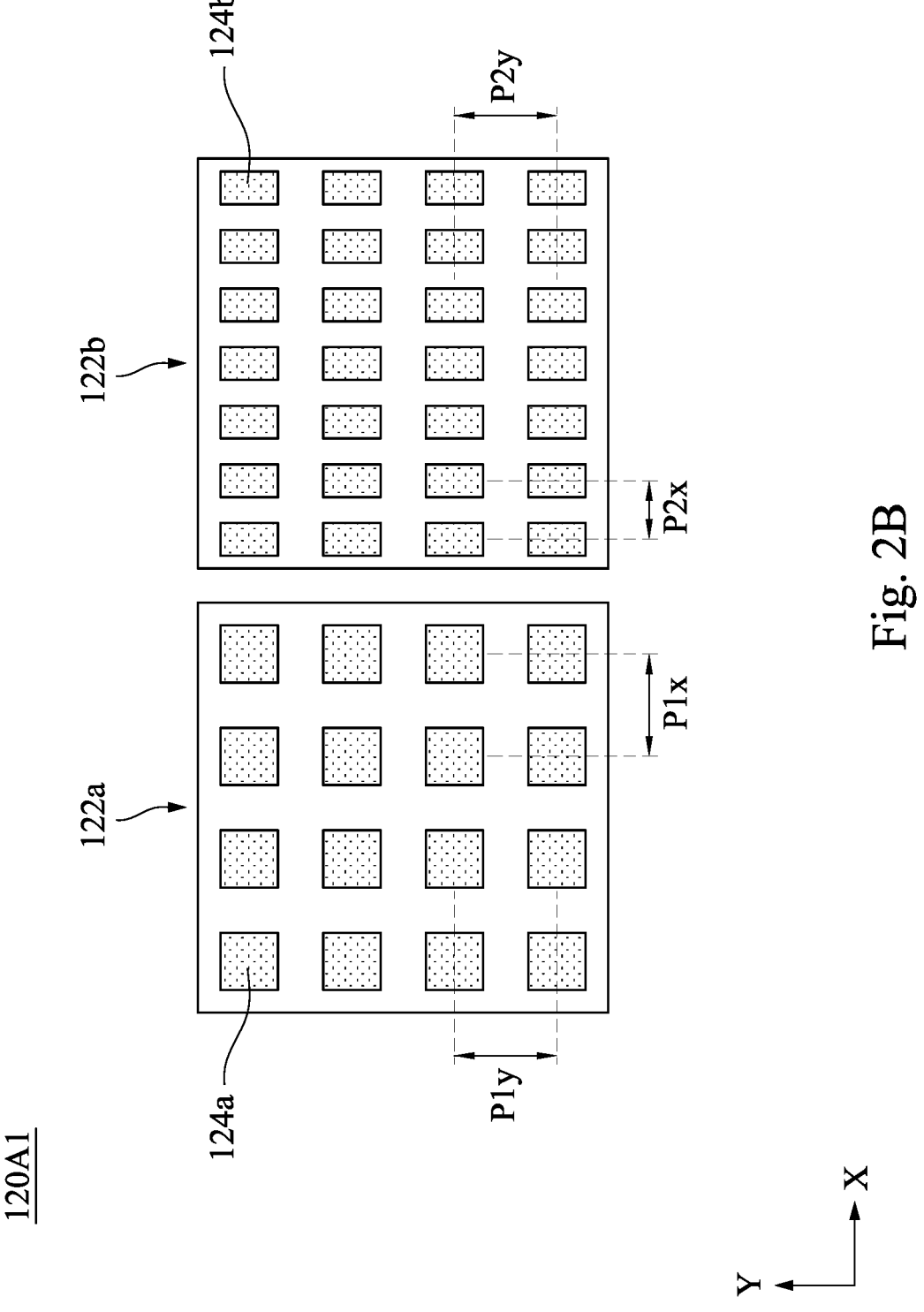
Figure 2C:
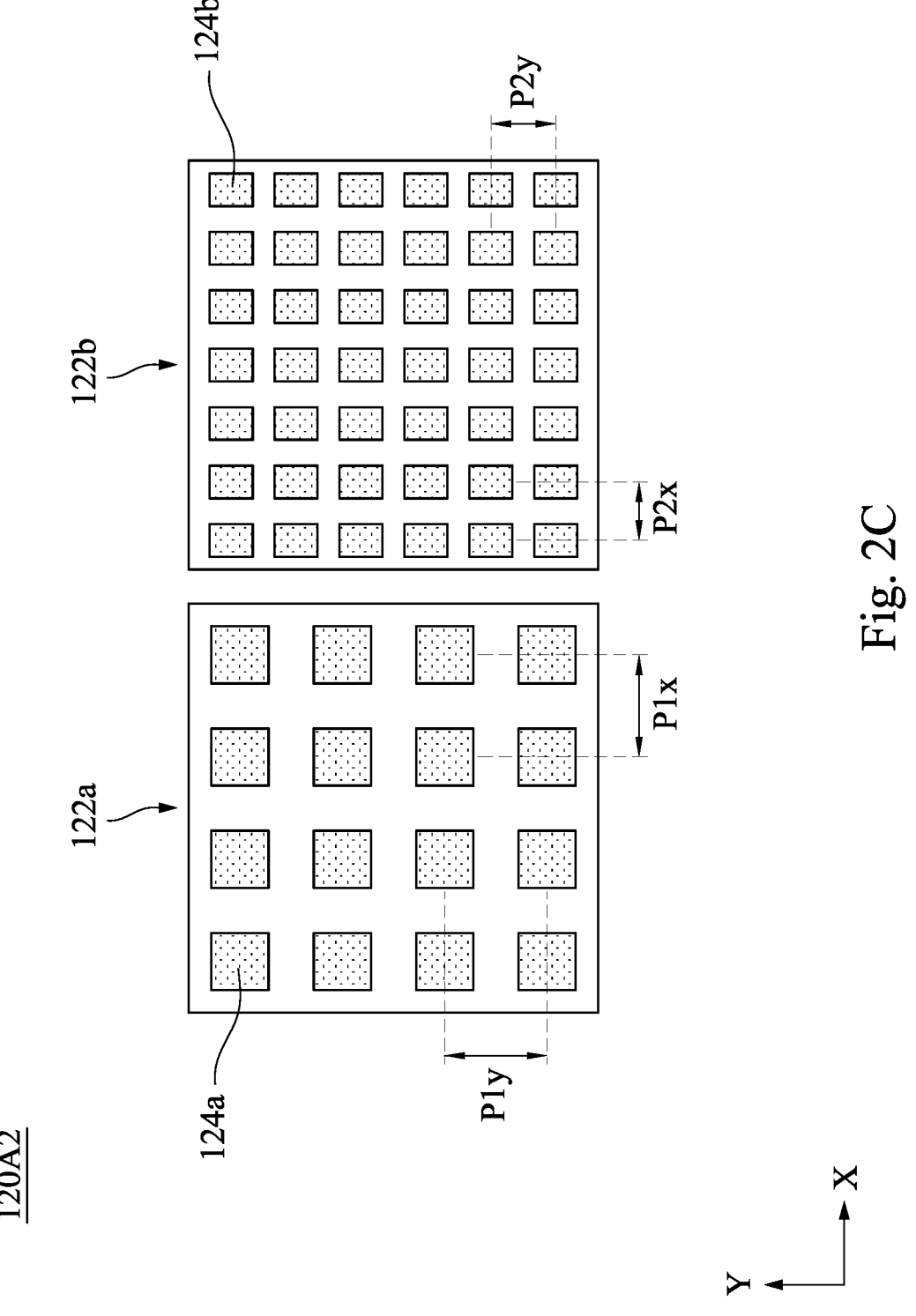

FIG. 2A is a cross-sectional view of an image sensor 100A in accordance with some embodiments of the present disclosure. FIG. 2B and FIG. 2C are top views of top surfaces of pillar array layers 120A in FIG. 2A. Specifically, both a pillar array layer 120A1 in FIG. 2B and a pillar array layer 120A2 in FIG. 2C are top views of top surfaces of the image sensor 100A in FIG. 2A.

Please refer to FIG. 2B. The pillar array layer 120A1 includes the first pillar array 122*a* and the second pillar array 122*b*, the arrangement of the first pillar array 122*a* is a 4×4 array, and the arrangement of the second pillar array 122*b* is a 7×4 array. Specifically, the pitch Pix between two of the first pillar structures 124*a* in the direction X is greater than the pitch P2x between two of the second pillar structures 124*b* in the direction X, and the pitch Ply between two of the first pillar structures 124*a* in the direction Y is the same as the pitch P2y between two of the second pillar structures 124*b* in the direction Y. In some embodiments, each top surface of the first pillar structures 124*a* in the first pillar array 122*a* is a square shape, and each top surface of the second pillar structures 124*b* in the second pillar array 122*b* is a rectangle shape, as shown in FIG. 2B. Since the number of the first pillar structures 124*a* and the number of the second pillar structures 124*b* are different, the diffraction of the light L may be improved to reduce the petal flares of the image sensor 100A (see FIG. 2A).

Please refer to FIG. 2C. The pillar array layer 120A2 includes the first pillar array 122*a* and the second pillar array 122*b*, the arrangement of the first pillar array 122*a* is a 4×4 array, and the arrangement of the second pillar array 122*b* is a 7×6 array. Specifically, the pitch P1x between two of the first pillar structures 124*a* in the direction X is greater than the pitch P2x between two of the second pillar structures 124*b* in the direction X, and the pitch Ply between two of the first pillar structures 124*a* in the direction Y is greater than the pitch P2y between two of the second pillar structures 124*b* in the direction Y. Since the number of the first pillar structures 124*a* and the number of the second pillar structures 124*b* are different, the diffraction of the light L may be improved to reduce the petal flares of the image sensor 100A (see FIG. 2A).

Please refer to FIG. 2A, FIG. 2B, and FIG. 2C, all the first pillar structures 124*a* have the first height H1, all the second pillar structures 124*b* have the second height H2, and the first height H1 is the same as the second height H2. However, the pitch (including the pitch Pix in the direction X and/or the pitch Ply in the direction Y) between two of the first pillar structures 124*a* is different from the pitch (including the pitch P2x in the direction X and/or the pitch P2y in the direction Y) between two of the second pillar structures 124*b*.

Figure 3A:
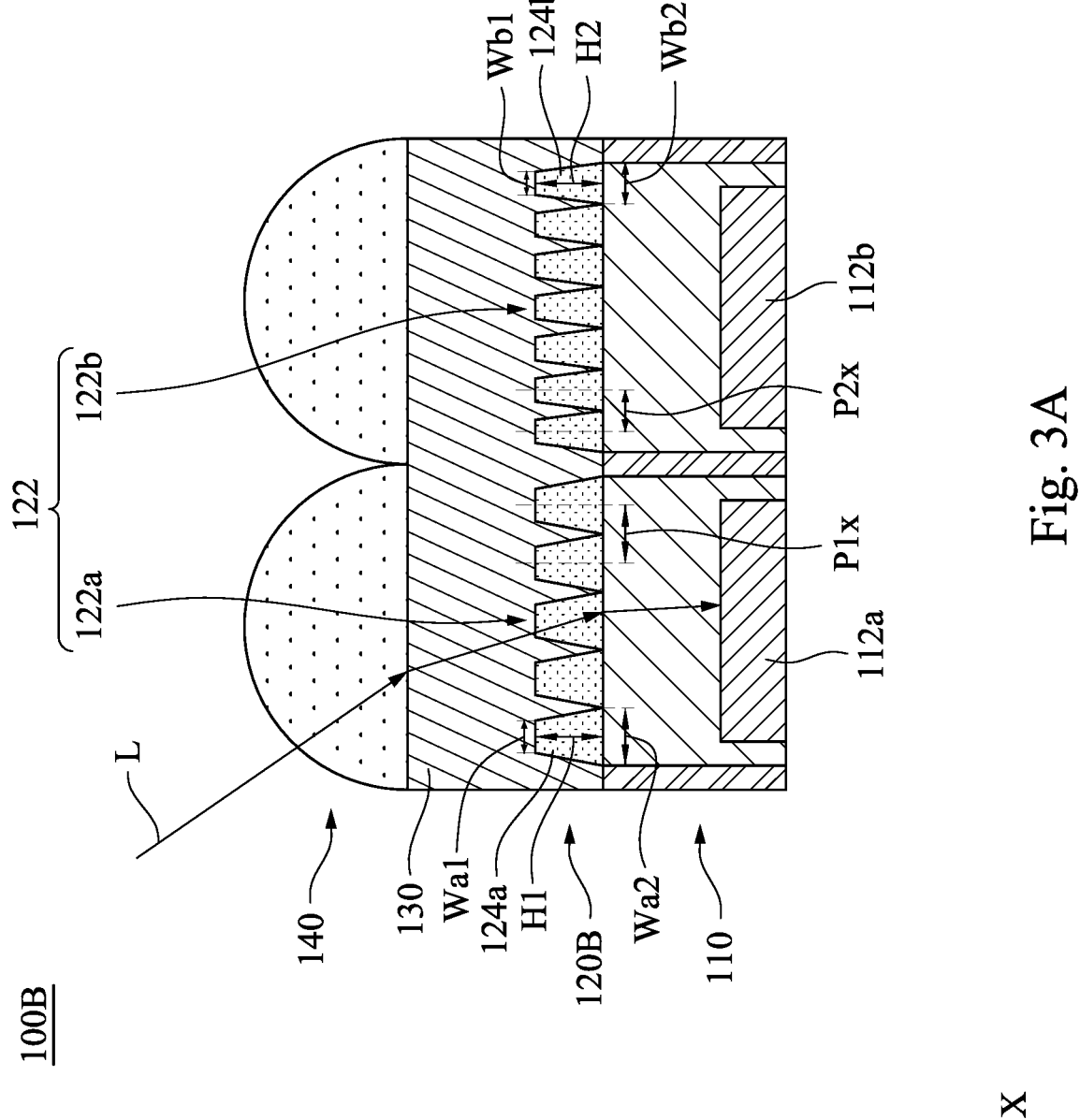
FIG. 3A is a cross-sectional view of an image sensor in accordance with some embodiments of the present disclosure.
Figure 3B:
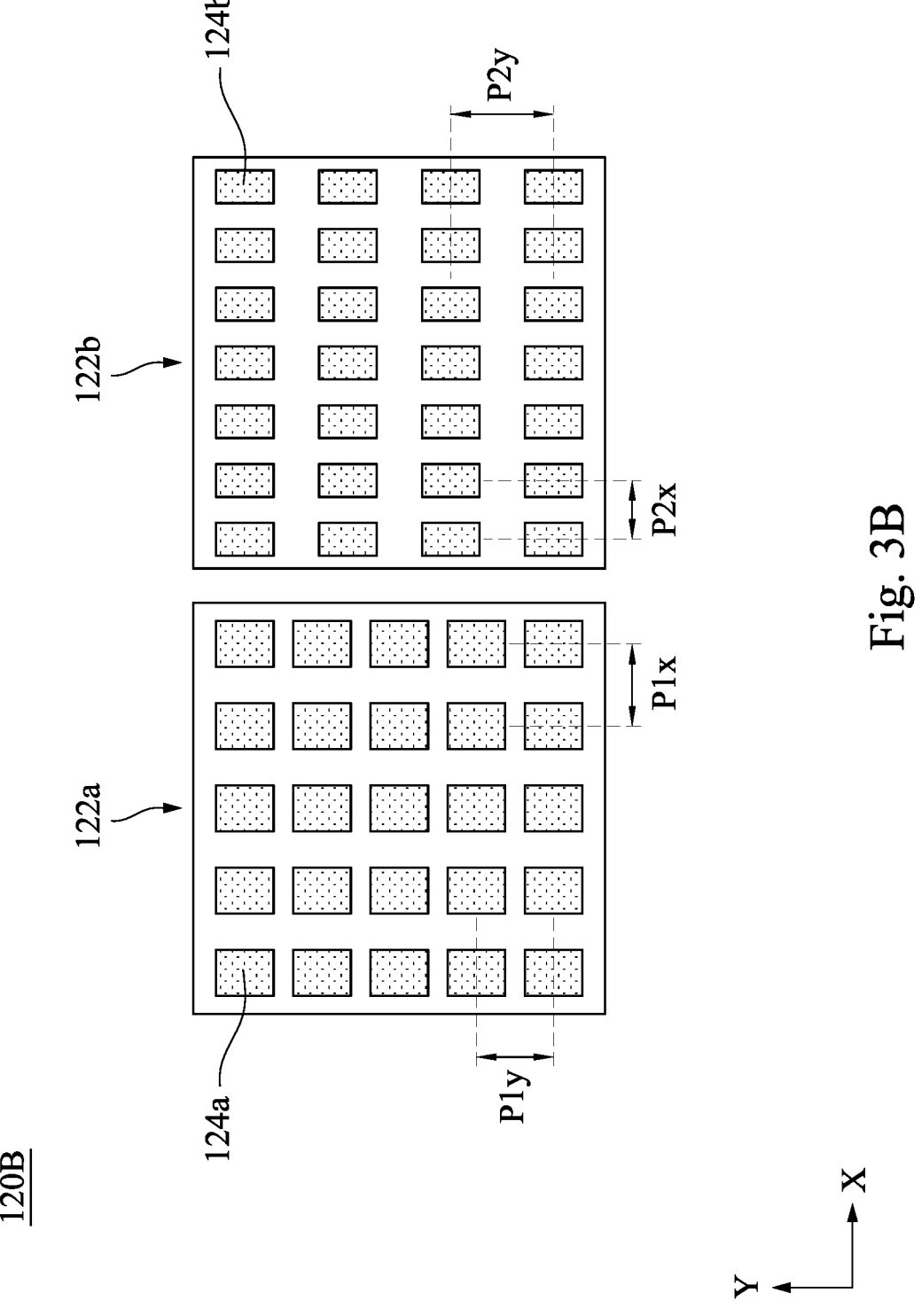
FIG. 3B is a top view of a top surface of a pillar array layer in FIG. 3A.

FIG. 3A is a cross-sectional view of an image sensor 100B in accordance with some embodiments of the present disclosure. FIG. 3B is a top view of the top surface of the pillar array layer 120B in FIG. 3A.

Please refer to FIG. 3B. The pillar array layer 120B includes the first pillar array 122*a* and the second pillar array 122*b*, the arrangement of the first pillar array 122*a* is a 5×5 array, and the arrangement of the second pillar array 122*b* is a 7×4 array. Specifically, the pitch Pix between two of the first pillar structures 124*a* in the direction X is greater than the pitch P2x between two of the second pillar structures 124*b* in the direction X, and the pitch Ply between two of the first pillar structures 124*a* in the direction Y is less than the pitch P2y between two of the second pillar structures 124*b* in the direction Y. Since the number of the first pillar structures 124*a* and the number of the second pillar structures 124*b* are different, the diffraction of the light L may be improved to reduce the petal flares of the image sensor 100B (see FIG. 3A).

Please refer to FIG. 3A and FIG. 3B, all the first pillar structures 124*a* have the first height H1, all the second pillar structures 124*b* have the second height H2, and the first height H1 is the same as the second height H2. However, the pitch (including the pitch Pix in the direction X and the pitch Ply in the direction Y) between two of the first pillar structures 124*a* is different from the pitch (including the pitch P2x in the direction X and the pitch P2y in the direction Y) between two of the second pillar structures 124*b*.

Figure 4:
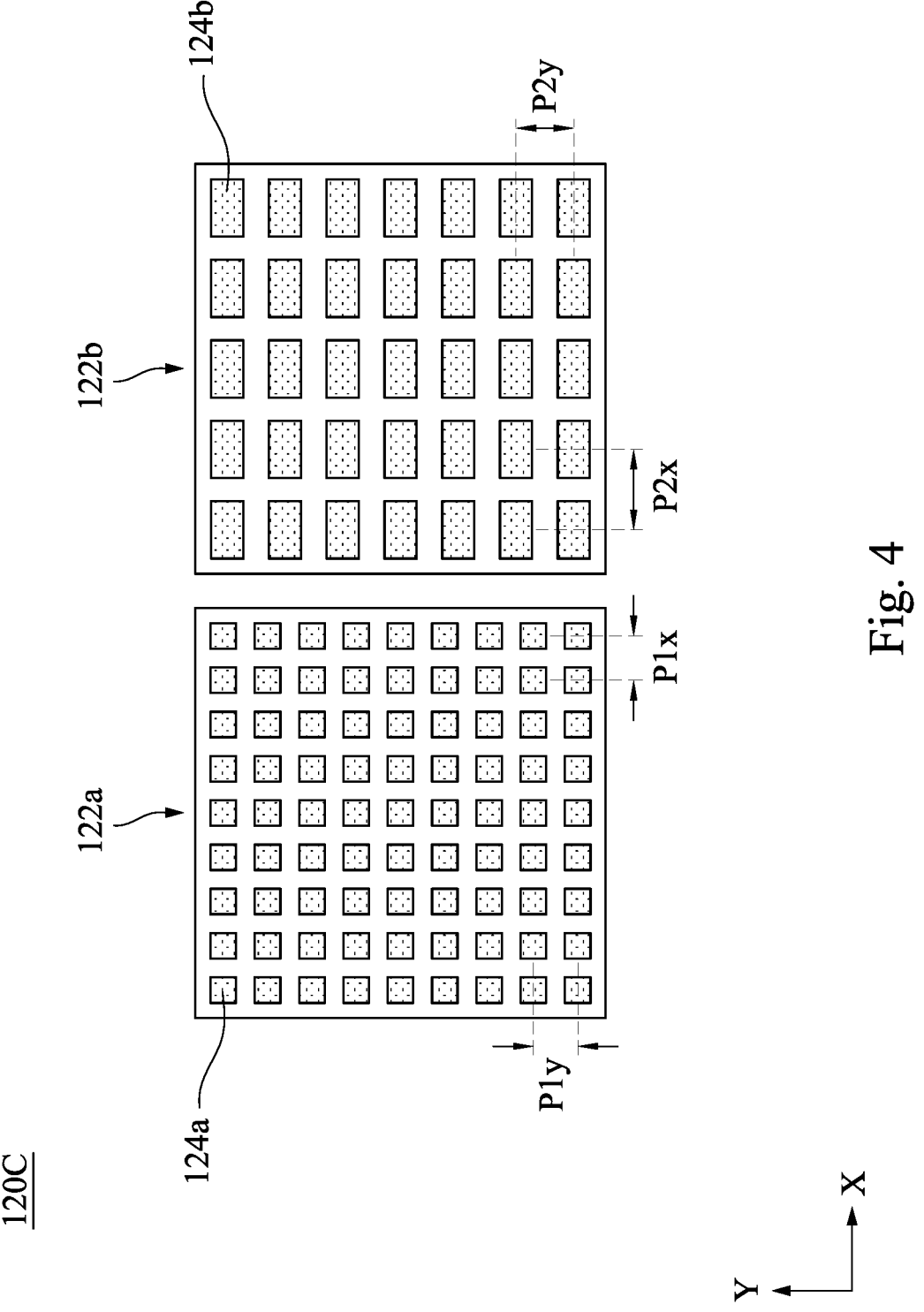
FIG. 4 is a top view of a top surface of the pillar array layer in accordance with some embodiments of the present disclosure.

FIG. 4 is a top view of the top surface of the pillar array layer 120C in accordance with some embodiments of the present disclosure. As shown in FIG. 4, the arrangement of the first pillar array 122*a* is a 9×9 array, and the arrangement of the second pillar array 122*b* is a 5×7 array. Specifically, the pitch P1x between two of the first pillar structures 124*a* in the direction X is less than the pitch P2x between two of the second pillar structures 124*b* in the direction X, and the pitch Ply between two of the first pillar structures 124*a* in the direction Y is less than the pitch P2y between two of the second pillar structures 124*b* in the direction Y.

Figures 5A, 5B:
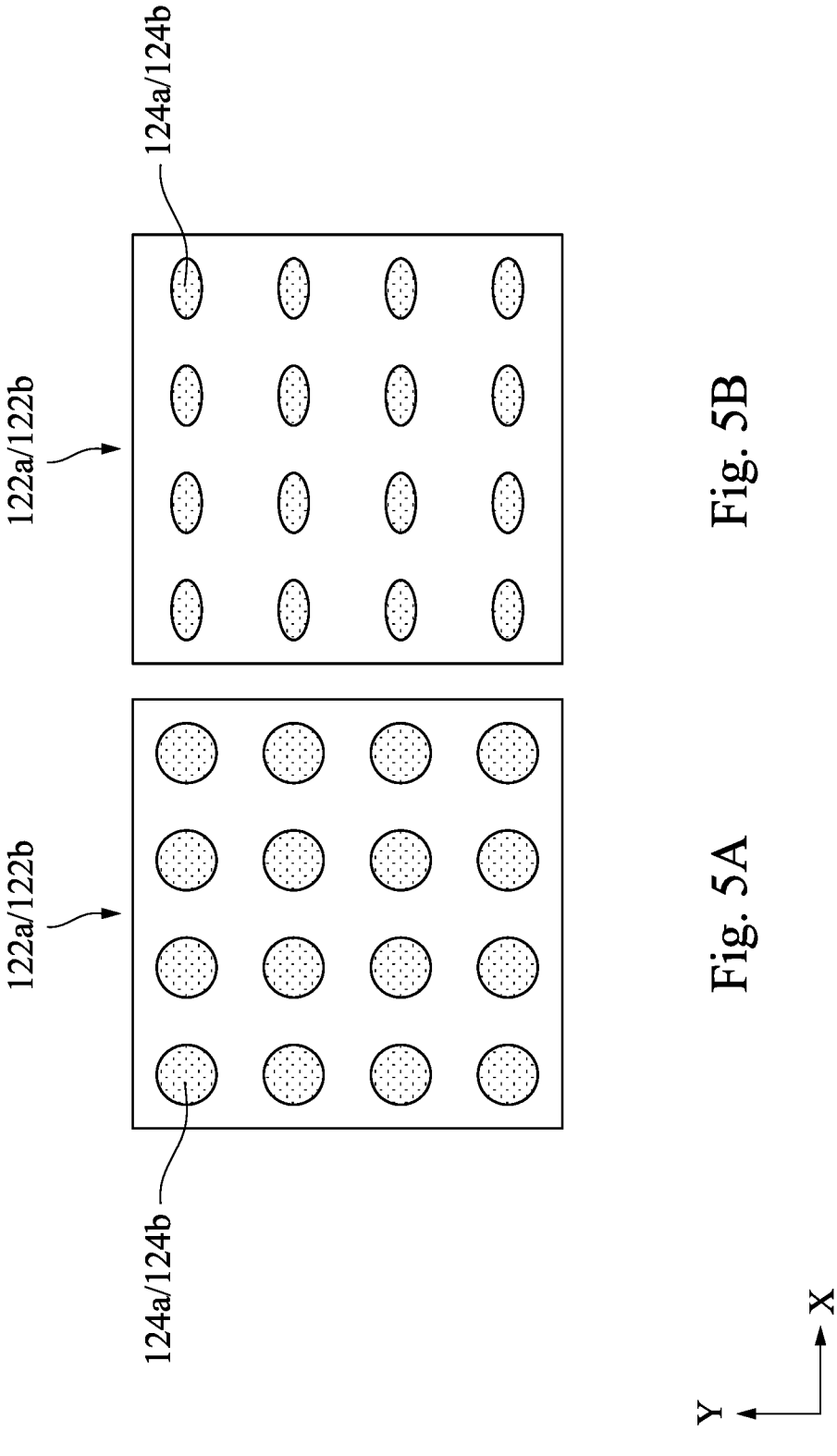
FIG. 5A and FIG. 5B are top views of top surfaces of a first pillar array or a second pillar array in accordance with some alternative embodiments of the present disclosure.

FIG. 5A and FIG. 5B are top views of top surfaces of the first pillar array 122*a* or the second pillar array 122*b* in accordance with some alternative embodiments of the present disclosure. Please refer to FIG. 5A, a shape of the top surface of the each first pillar structure 124*a* or the each second pillar structure 124*b* is a circle shape. Please refer to FIG. 5B, a shape of the top surface of the each first pillar structure 124*a* or the each second pillar structure 124*b* is an ellipse shape. It is understood that the shape of the top surface of the each first pillar structure 124*a* and/or the each second pillar structure 124*b* could be a rectangle, circle, square, or ellipse shape. In some embodiments, the shape of the bottom surface of the each first pillar structure 124*a* and/or the each second pillar structure 124*b* could be a rectangle, circle, square, or ellipse shape. In some embodiments, the shape of the each first pillar structure 124*a* is different from the shape of the each second pillar structure 124*b*. Since the shape of the first pillar structures 124*a* and the shape of the second pillar structures 124*b* are different, the diffraction of the light L (see FIG. 1A, FIG. 2A, and FIG. 3A) may be improved to reduce the petal flares of the image sensor.

Figure 6:
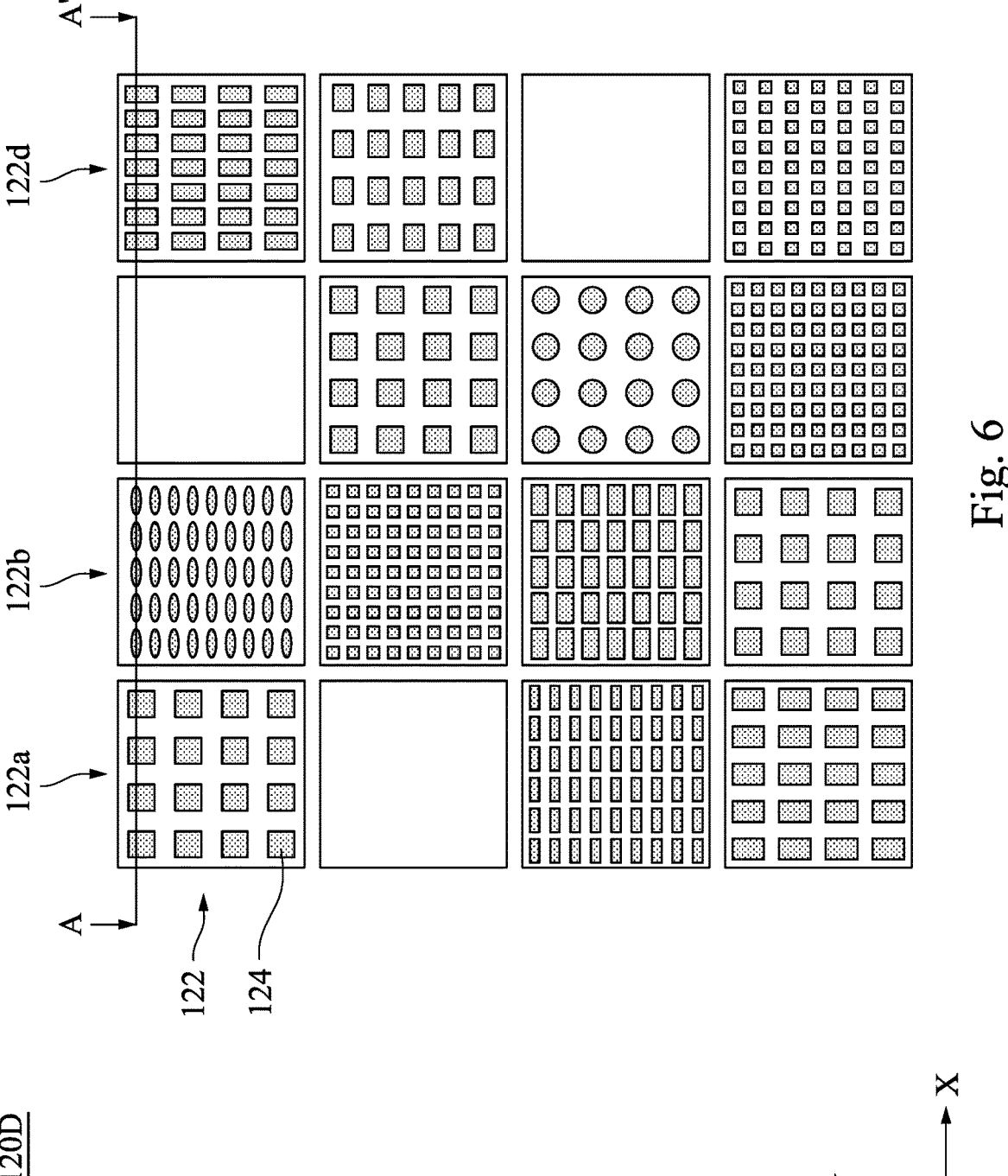
FIG. 6 is a top view of a top surface of a pillar array layer in accordance with some embodiments of the present disclosure.

FIG. 6 is a top view of the top surface of a pillar array layer 120D in accordance with some embodiments of the present disclosure. FIG. 6 illustrates 16 arrays, and the shape of the top surface of the each pillar structure 124 in these arrays is a rectangle, circle, square, or ellipse shape. It is noticed that some portions of the pillar array layer are free of any pillar structures, for example, the portion between the 122*b* and a pillar array 122*d*.

Figure 7:
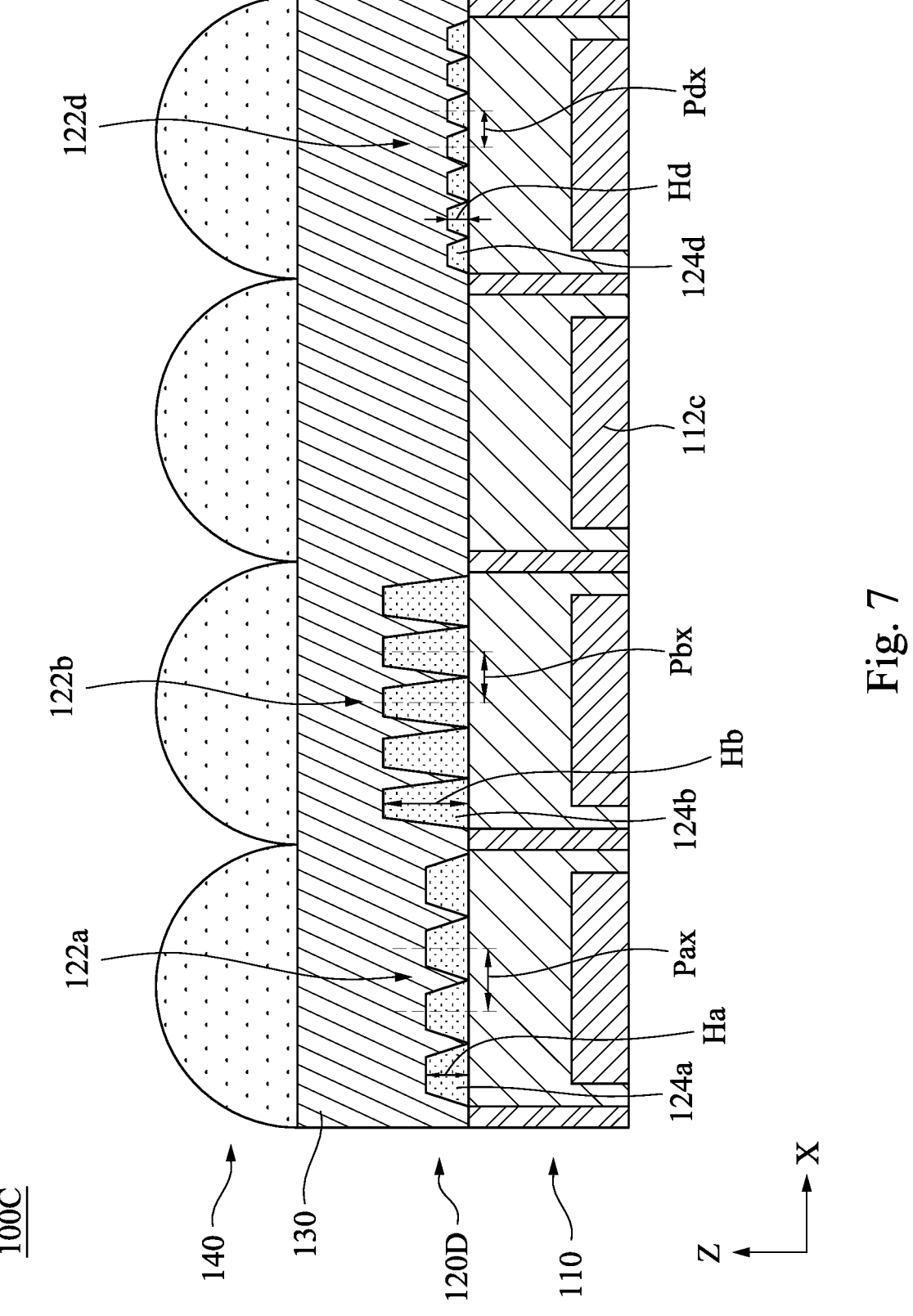
FIG. 7 is a cross-sectional view of an image sensor including the pillar array layer in FIG. 6, in which the cross-sectional view taken along a line A-A' in FIG. 6.

FIG. 7 is a cross-sectional view of an image sensor 100C including the pillar array layer 120D in FIG. 6, in which the cross-sectional view taken along a line A-A' in FIG. 6. As shown in FIG. 7, the pillar array layer 120D includes a plurality of pillar arrays 122*a*, 122*b*, 122*d*. Specifically, the pillar array 122*a* includes a plurality of pillar structures 124*a*, the pillar array 122*b* includes a plurality of pillar structures 124*b*, and the pillar array 122*d* includes a plurality of pillar structures 124*d*. It is noticed that a portion of the pillar array layer 120D above a third photodiode 112*c* is free of any pillar structures (such as pillar structures 124*a*, 124*b*, 124*d*). A height Ha of the pillar structures 124*a*, a height Hb of the pillar structures 124*b*, and a height Hd of the pillar structures 124*d* are different from each other. It is understood that the height Ha, the height Hb, and height Hd has the same or similar features discussed above. A pitch Pax between two of the pillar structures 124*a* in the direction X, a pitch Pbx between two of the pillar structures 124*b* in the direction X, and a pitch Pdx between two of the pillar structures 124*d* in the direction X are different from each other. It is understood that the pitch Pax, the pitch Pbx, and pitch Pdx has the same or similar features discussed above.

Please refer to FIG. 1A, FIG. 2A, and FIG. 3A again. In the pillar array layers 120, 120A, 120B of the image sensors 100, 100A, 100B, all the first pillar structures 124*a* in the first pillar array 122*a* have the same first height H1, and all the second pillar structures 124*b* in the second pillar array 122*b* have the same second height H2. The pillar array layer 120 satisfies at least one of the following conditions: (1) the first height H1 of the each first pillar structure 124*a* is different from the second height H2 of the each second pillar structure 124*b* (see FIG. 1A and FIG. 1B), (2) the pitch (including the pitch P1x in the direction X and/or the pitch P1y in the direction Y) between two of the first pillar structures 124*a* is different from the pitch (including the pitch P2x in the direction X and/or the pitch P2y in the direction Y) between two of the second pillar structures 124*b* (see FIG. 2A, FIG. 2B, FIG. 2C, FIG. 3A, FIG. 3B, and FIG. 4); or (3) the shape of the each first pillar structure 124*a* is different from the shape of the each second pillar structure 124*b* (see FIG. 2B, FIG. 2C, FIG. 3B, FIG. 4, FIG. 5A, and FIG. 5B).

FIG. 8 is a flow chart of a method 800 of manufacturing the image sensor 100 in accordance with some embodiments of the present disclosure. FIG. 9 to FIG. 13 are cross-sectional views at various steps of the method 800 of manufacturing the image sensor 100 according to some embodiment of the present disclosure.

Figure 9:
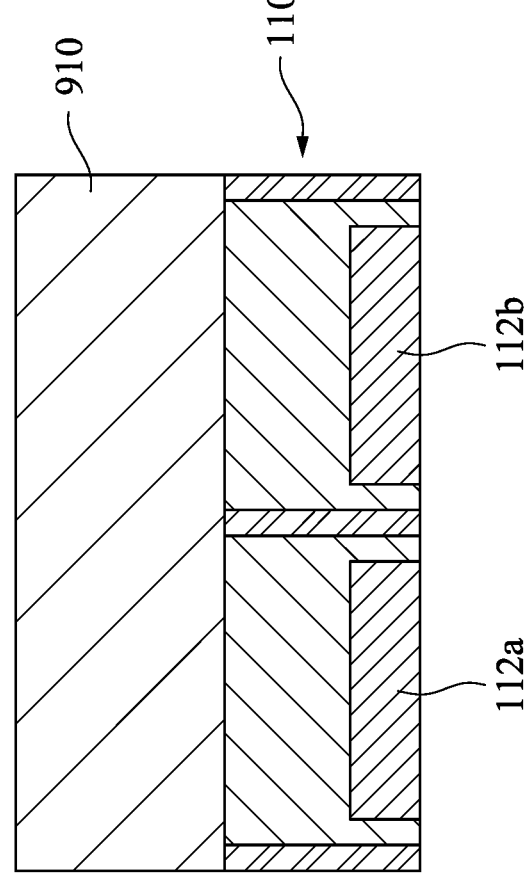
FIG. 9 to FIG. 13 are cross-sectional views at various steps of a method of manufacturing an image sensor according to some embodiment of the present disclosure.
Figure 10:
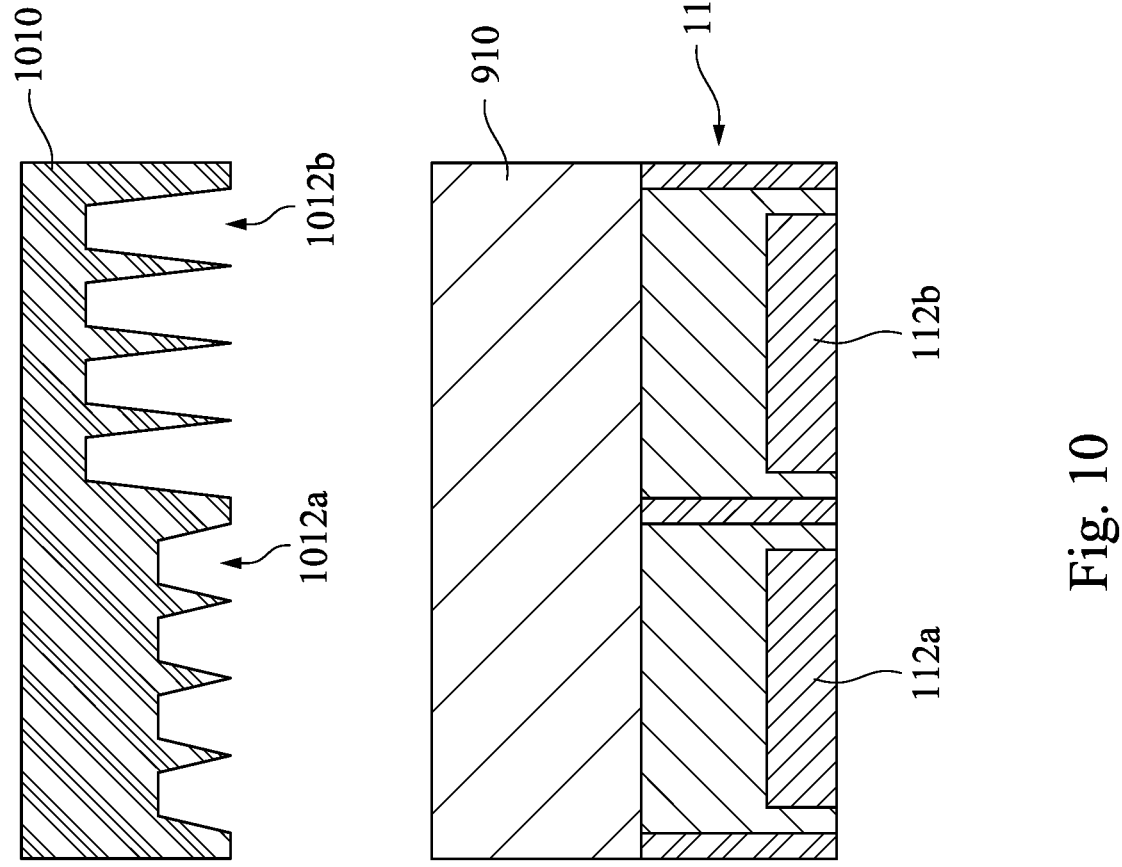
Figure 11:
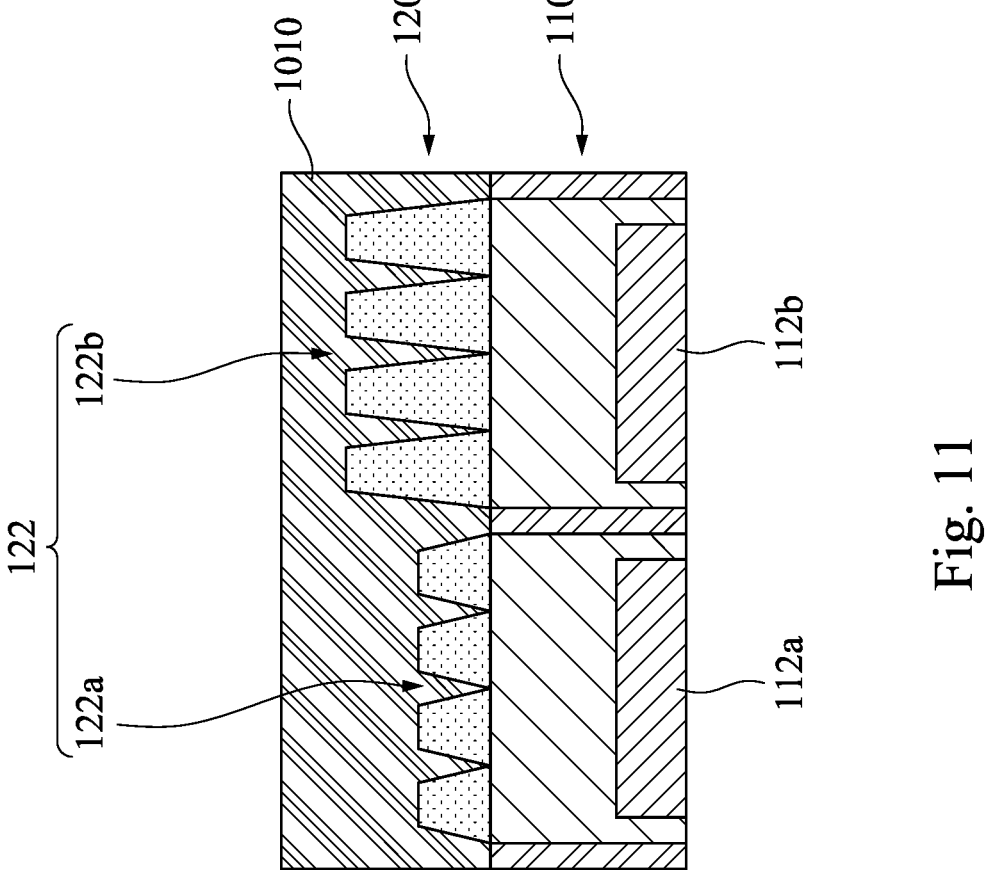
Figure 12:
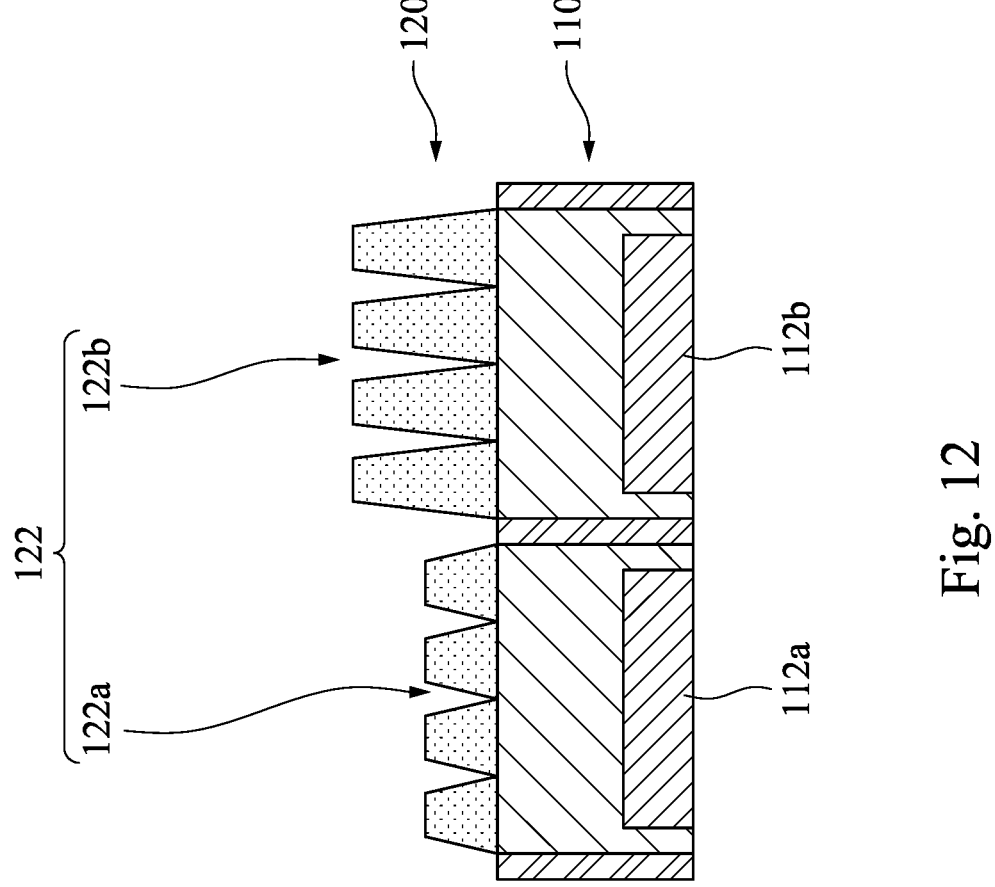
Figure 13:
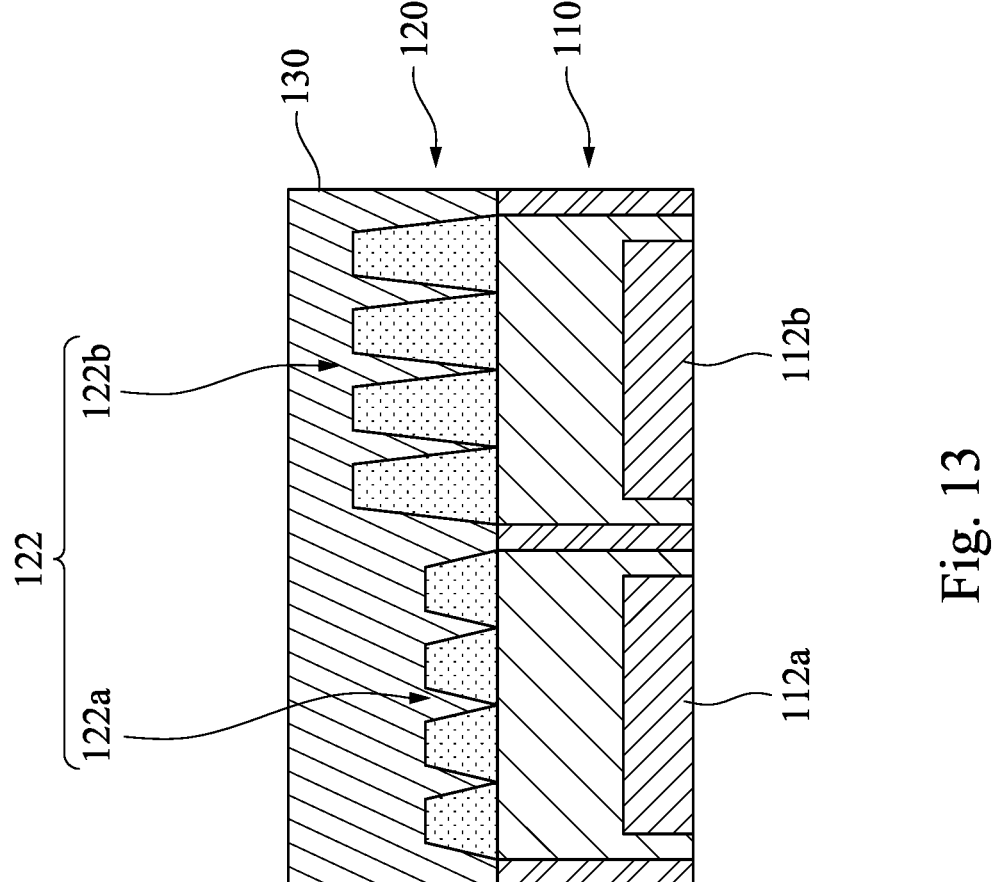

The method 800 includes a step S1 to a step S5. In the step S1 of FIG. 8, the semiconductor substrate 110 including the first photodiode 112*a* and the second photodiode 112*b* is received. In the step S2 of FIG. 8, a light-transmissive layer 910 is formed on the semiconductor substrate 110, as shown in FIG. 9. In some embodiments, the light-transmissive layer 910 may be made of a material that includes a photosensitive base resin. In the step S3 of FIG. 8, the light-transmissive layer 910 is imprinted by a mold 1010 to form the pillar array layer 120, in which the pillar array layer 120 includes the first pillar array 122*a* disposed above the first photodiode 112*a* and the second pillar array 122*b* disposed above the second photodiode 112*b*, as shown in FIG. 10 and FIG. 11. In some embodiments, the imprinting process may be a nanoimprint lithography (NIL) process. In some embodiments, the mold 1010 may be made of a material that includes polymer. Please refer to FIG. 10, the mold 1010 includes a first recess 1012*a* and a second recess 1012*b*, and a depth of the first recess 1012*a* is different from a depth of the second recess 1012*b*. The first recess 1012*a* and the second recess 1012*b* of the mold 1010 may be formed by lithography, laser direct-writing lithography, etching and diamond turning process. In some embodiments, shapes of the first recess 1012*a* and the second recess 1012*b* of the mold 1010 are rectangle, circle, square, or ellipse shapes. Please refer to FIG. 11, after the step S3, performing a curing operation on the light-transmissive layer 910 to form the pillar array layer 120 including the first pillar array 122*a* and the second pillar array 122*b*. Please refer to FIG. 12, after the curing operation, the mold 1010 is removed from the pillar array layer 120 and the semiconductor substrate 110. In other words, the shape of the mold 1010 is transferred on the pillar array layer 120. In the step S4 of FIG. 8, the planar layer 130 is formed on the pillar array layer 120, as shown in FIG. 13. Specifically, the planar layer 130 covers the pillar array layer 120 and the semiconductor substrate 110. In some embodiments, the planar layer 130 is formed by a coating process. In the step S5 of FIG. 8, the microlens layer 140 is formed on the planar layer 130.

The image sensor of the present disclosure includes a plurality of pillar arrays, and each of the pillar arrays has a plurality of pillar structures. All the pillar structures are tapered structures, so that refractive indexes of the tapered structures are smoothly changed. Therefore, after light L entering into the image sensor through the pillar array layer between microlens and photodiodes, the light would not tend to be reflected, so that a path of the light may be extended, thereby increasing the light absorption rate of the photodiodes and the performance of the image sensor. All the pillar structures in each pillar array have the same height. The heights, pitches (including the pitch in the direction X and the pitch in the direction Y), and shapes of the pillar structures may be different among the plurality of pillar arrays, so that the petal flares generated by the diffraction of the light L may be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
    a semiconductor substrate comprising a first photodiode and a second photodiode;
    a pillar array layer disposed on the semiconductor substrate, the pillar array layer comprising a first pillar array disposed above the first photodiode and a second pillar array disposed above the second photodiode,
        wherein the first pillar array comprises a plurality of first pillar structures, the second pillar array comprises a plurality of second pillar structures, all the first pillar structures have a first height, all the second pillar structures have a second height, and the pillar array layer satisfies the following conditions:
        a shape of each of the first pillar structure is different from a shape of each of the second pillar structure, wherein the shape of a top planar surface of each of the first pillar structure is a rectangle, circle, square, or ellipse shape from a top view, and the shape of a top planar surface of each of the second pillar structure is a rectangle, circle, square, or ellipse shape from a top view;
    a planar layer disposed on the pillar array layer; and
    a microlens layer disposed on the planar layer, wherein a refractive index of the microlens layer is less than a refractive index of the planar layer, the refractive index of the planar layer is less than a refractive index of the pillar array layer, and the refractive index of the pillar array layer is less than a refractive index of the semiconductor substrate.

2. The image sensor of claim 1, wherein the first height of each of the first pillar structure is different from the second height of each of the second pillar structure, the first height of each of the first pillar structure is in a range from 0.1 μm to 1.6 μm, and the second height of each of the second pillar structure is in a range from 0.1 μm to 1.6 μm.

3. The image sensor of claim 1, wherein a pitch between two of the first pillar structures is different from a pitch between two of the second pillar structures, the pitch between two adjacent of the first pillar structures is in a range from 0.3 μm to 0.5 μm, and the pitch between two adjacent of the second pillar structures is in a range from 0.3 μm to 0.5 μm.

4. The image sensor of claim 3, wherein the pitch between two of the first pillar structures in a first direction is greater than the pitch between two of the second pillar structures in the first direction, the pitch between two of the first pillar structures in a second direction is the same as the pitch between two of the second pillar structures in the second direction, and the first direction is substantially perpendicular to the second direction.

5. The image sensor of claim 3, wherein the pitch between two of the first pillar structures in a first direction is greater than the pitch between two of the second pillar structures in the first direction, the pitch between two of the first pillar structures in a second direction is greater than the pitch between two of the second pillar structures in the second direction, and the first direction is substantially perpendicular to the second direction.

6. The image sensor of claim 3, wherein the pitch between two of the first pillar structures in a first direction is greater than the pitch between two of the second pillar structures in the first direction, the pitch between two of the first pillar structures in a second direction is less than the pitch between two of the second pillar structures in the second direction, and the first direction is substantially perpendicular to the second direction.

7. The image sensor of claim 1, wherein an arrangement of the first pillar array is a A×B array, an arrangement of the second pillar array is a C×D array, A, B, C, D are positive integers, A is different from or equal to B, and C is different from or equal to D.

8. The image sensor of claim 7, wherein A, B, C, and D are in a range from 4 to 9.

9. The image sensor of claim 1, wherein the shape of a bottom planar surface of each of the first pillar structure is a rectangle, circle, square, or ellipse shape from a top view, and the shape of a bottom planar surface of each of the second pillar structure is a rectangle, circle, square, or ellipse shape from a top view.

10. The image sensor of claim 1, wherein a width of a top planar surface of each of the first pillar structure is less than a width of a bottom planar surface of each of the first pillar structure, and a width of a top planar surface of each of the second pillar structure is less than a width of a bottom planar surface of each of the second pillar structure.

11. The image sensor of claim 10, wherein the width of the top planar surface of each of the first pillar structure is in a range from 0.16 μm to 0.4 μm, the width of the bottom planar surface of each of the first pillar structure is in a range from 0.2 μm to 0.5 μm, the width of the top planar surface of each of the second pillar structure is in a range from 0.16 μm to 0.4 μm, and the width of the bottom planar surface of each of the second pillar structure is in a range from 0.2 μm to 0.5 μm.

12. The image sensor of claim 1, wherein all the first pillar structures are identical, all the second pillar structures are identical, and the first pillar structures are different from the second pillar structures.

13. The image sensor of claim 1, wherein a refractive index of the first pillar structures is in a range from 1.4 to 1.6, and a refractive index of the second pillar structures is in a range from 1.4 to 1.6.

14. The image sensor of claim 1, wherein a thickness of the planar layer is in a range from 3.3 μm to 3.9 μm.

15. The image sensor of claim 1, wherein a material of the pillar array layer is different from a material of the planar layer.

16. The image sensor of claim 1, wherein the image sensor is configured to receive a light having a wavelength in a range from 920 nm to 960 nm.

17. The image sensor of claim 1, wherein the semiconductor substrate further comprises a third photodiode, and a portion of the pillar array layer above the third photodiode is free of any pillar structures.

\* \* \* \* \*